United States Patent
Chen

(10) Patent No.: US 7,030,792 B2
(45) Date of Patent: Apr. 18, 2006

(54) SUPPRESSING DIGITAL-TO-ANALOG CONVERTER (DAC) ERROR

(75) Inventor: Feng Chen, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/237,250

(22) Filed: Sep. 28, 2005

(65) Prior Publication Data

US 2006/0022857 A1    Feb. 2, 2006

Related U.S. Application Data

(62) Division of application No. 10/723,472, filed on Nov. 26, 2004.

(51) Int. Cl.
  *H03M 1/06* (2006.01)
  *H03M 3/00* (2006.01)
  *G06F 15/00* (2006.01)
  *G06F 7/00* (2006.01)

(52) U.S. Cl. .................. 341/118; 341/143; 708/209

(58) Field of Classification Search .............. 341/143, 341/144, 118; 375/252, 346, 350, 371; 377/64; 382/232; 708/209, 445; 345/570
See application file for complete search history.

(56) References Cited

U.S. PATENT DOCUMENTS

| | | | | |
|---|---|---|---|---|
| 4,193,118 A | | 3/1980 | Nash et al. ............... 708/445 |
| 4,653,019 A | * | 3/1987 | Hodge et al. ............. 708/209 |
| 5,052,027 A | * | 9/1991 | Poklemba et al. ......... 375/350 |
| 5,216,696 A | * | 6/1993 | Poklemba ................. 375/346 |
| 5,233,689 A | * | 8/1993 | Rhoden et al. ........... 345/570 |
| 5,406,283 A | | 4/1995 | Leung .................... 341/143 |
| 5,479,527 A | * | 12/1995 | Chen ..................... 382/232 |
| 5,485,490 A | * | 1/1996 | Leung et al. ............. 375/371 |
| 6,304,608 B1 | | 10/2001 | Chen ..................... 375/252 |
| 6,314,156 B1 | * | 11/2001 | Moll et al. ............... 377/64 |
| 6,344,812 B1 | * | 2/2002 | Takeda et al. ............ 341/143 |
| 6,535,155 B1 | | 3/2003 | Ruha et al. .............. 341/144 |
| 6,611,221 B1 | | 8/2003 | Soundarapandlan ...... 341/143 |
| 6,697,003 B1 | | 2/2004 | Chen ..................... 341/143 |
| 6,697,004 B1 | | 2/2004 | Galton et al. ............ 341/144 |
| 6,737,999 B1 | | 5/2004 | Schreier ................. 341/118 |
| 6,738,004 B1 | | 5/2004 | Melanson ................ 341/143 |
| 6,784,816 B1 | | 8/2004 | Melanson ................ 341/143 |
| 6,803,869 B1 | | 10/2004 | Melanson et al. ........ 341/143 |
| 6,867,721 B1 | | 3/2005 | Lin ...................... 341/144 |

OTHER PUBLICATIONS

"A Study of Dynamic Element-Matching Techniques for 3-Level Unit Elements", Rombouts et al., IEEE Transactions On Circuits and Systems, vol. 47, No. 11, Nov. 2000.

* cited by examiner

*Primary Examiner*—Patrick Wamsley
(74) *Attorney, Agent, or Firm*—Wade James Brady, III; Frederick J. Telecky, Jr.

(57) ABSTRACT

A digital-to-analog converter (DAC) error suppression arrangement suppresses DAC error arising from mismatched elements contained in a DAC (640 and/or 645) that is part of a modulator (FIG. 6). A low pass averaging (LPA) index decoder 650 controls a shifting arrangement 635 to shift a digital word T2 derived from modulator output Y so that the DAC error distribution constitutes a low pass profile (FIG. 5). Thus, DAC error is suppressed at higher frequencies (close to half the sampling rate), thereby providing improved spurious free dynamic range (SFDR). The LPA index decoder 650 causes the shifting arrangement 635 to shift the digital word T2 using only a single pointer per clock cycle.

8 Claims, 3 Drawing Sheets

SUPPRESSING DIGITAL-TO-ANALOG CONVERTER (DAC) ERROR

This application is a division of Ser. No. 10/723,472, filed Nov. 26, 2004.

BACKGROUND OF THE INVENTION

1. Field of the Invention

The invention generally relates to arrangements for suppressing digital-to-analog converter (DAC) error, especially at high frequencies. More particularly, the invention relates to arrangements for suppressing DAC error using dynamic averaging techniques.

2. Related Art

Sigma delta modulators (SDMs) are used in data converters, such as analog-to-digital converters (ADCs), in which the SDM performs noise shaping functions. SDMs may be first order, second order, or n-th order, where n is a positive integer.

A typical first order SDM includes a filter (such as an integrator circuit) and a quantizer (such as a flash ADC). The filter receives an analog input signal as well as a feedback signal. The quantizer quantizes the filter output signal to create a digital output. In its simplest form, the quantizer may be a single bit ADC such as a comparator circuit.

A digital to analog converter (DAC) creates an analog representation of the SDM's current digital output. The DAC provides this analog representation as an analog feedback signal to the filter. Multiple order sigma delta modulators may include a series of filters in a forward path, each filtering the output of the previous filter and receiving an analog feedback signal based on a digitized output of the modulator. The first filter operates on the analog input signal to be converted and a feedback signal.

Multi-bit or multi-level sigma delta modulators (SDMs) provide multi-bit digital or quantized outputs, in which the ADC provides a multi-bit digital output representative of the input signal. In this case, the feedback DAC is a multi-bit converter as well.

Whereas single-bit SDMs can achieve good linearity, noise performance and stability are generally not as good as in multi-bit sigma delta modulators. The linearity of a multi-bit SDM is essentially limited by the linearity of the DAC, particularly nonlinearity due to mismatch of internal DAC components that causes distortion in the modulator. This distortion typically manifests as harmonics of the input signal, which is a serious problem for applications such as audio data conversion.

One approach for dealing with the non-linearity problems for multi-bit data converters involves dynamic element matching (DEM). DEM transforms the non-linearity error caused by DAC element mismatch into shaped noise. DEM also noise-shapes by changing the bit pattern of data such that most of the noise falls outside the signal band of interest. This out-of-band noise can then be filtered out, for example, by decimation filtering.

In general, DAC element mismatch is thus converted from a static error into wide-bandwidth noise by selecting different DAC elements to represent a digital input code at different times. Such DEM techniques may be employed in an SDM feedback path to vary the selection of mismatched components in the DAC in response to the quantized (e.g., digital input) signal.

Data weighted averaging (DWA) is one example of a DEM algorithm. However, DWA suffers from the production of unintended tone components in the output, sometimes referred to as idle channel tones. This problem is particularly troublesome for static (DC) or slowly changing input signals, and/or for low oversampling ratios (e.g., less than or equal to 8). In such situations, the modulator creates a repetitive pattern that manifests as a tonal component in the output spectrum. This degrades usable system range, which is sometimes measured as spurious free dynamic range (SFDR).

In a simple example, a digital-to-analog converter (DAC) has only two input bits. In this two-input-bit DAC, DAC output elements are provided in a four-bit word whose component bits are referred to herein as e1, e2, e3 and e4 (see examples in FIGS. 1–5). If the DAC has, for example, an input sequence 01, 10, 11, 11 (that is, 1, 2, 3, 3 as shown in FIGS. 1–5), and if a conventional "thermometer code" is used, the thermometer code sequence is 0001, 0011, 0111, 0111. If a bit is 1, its corresponding output element is activated.

In the conventional arrangement shown in FIG. 1, for example, "1" bits are shifted in from the "bottom" of the charts, based on successive values in the input sequence. The corresponding thermometer code 0001, 0011, 0111, 0111 can be read vertically in the columns in FIG. 1.

Dynamic element matching (DEM) techniques have been used to suppress DAC error in oversampling systems. However, conventional approaches generally produce either white noise or a high pass profiles DAC error.

With the conventional DAC conversion scheme shown in FIG. 1, a predetermined fixed set of DAC elements corresponds to each input code. Undesirably, harmonic distortion components due to element mismatch are generated, and spurious free dynamic range (SFDR) is therefore limited.

A first class of algorithms to improve spurious free dynamic range (SFDR) is random averaging (see FIG. 2 for an example). Random averaging involves randomly assigning elements from all available elements for each individual digital input to the DAC. As a result, DAC error is averaged out throughout the bandwidth and the error is converted to resemble white noise, as shown in the error distribution graph of FIG. 2.

Another class of algorithms involves converting DAC error into high pass noise (see FIG. 3 for an example). In such algorithms as DWA, DAC elements are chosen sequentially for each incoming digital code, with a direction of either single or multiple pointers. In FIG. 3, dots point to the location of the next shifting operation; the elements after the pointer are used for D/A conversion during a following clock cycle. As a result of the shifting operation, the DAC error due to element mismatch is averaged out at low frequency and only allowed to pass at high frequency. Accordingly, the error distribution is a high-pass distribution, as shown in the bottom panel of FIG. 3.

FIG. 4 shows an arrangement following the disclosure of I. Fujimori, L. Longo, A. Hairapetian, K. Seiyama, S. Kosic, J. Cao and S. Chan, "A 90 dB SNR, 2.5 MHz Output Rate ADC using Cascaded Delta Sigma Modulation at 8× Oversampling Ratio," 2000 *IEEE International Solid-State Circuits Conference (ISSCC)*, pp. 338–339 (2000). Fujimori's approach, although involving bidirectional data weighted averaging, still results in a high-pass error distribution that resembles that of FIG. 3. Also, significantly, Fujimori's approach involves two independent pointers in order to govern shifting in two directions, which adds to complexity of the design.

Accordingly, there is a need in the art to provide suppression of DAC error, especially at high frequencies around half the sampling frequency, so that a low pass error distribution profile is presented.

SUMMARY

Accordingly, there is provided a digital-to-analog converter (DAC) error suppression arrangement that suppresses DAC error arising from mismatched elements contained in a DAC that may, for example, be part of a modulator. A low pass averaging (LPA) index decoder controls a shifting arrangement to shift a digital word that may be derived from the modulator output so that the DAC error distribution constitutes a low pass profile. Thus, DAC error is suppressed at higher frequencies, close to half the sampling rate. In one embodiment, the LPA index decoder causes the shifting arrangement to shift the digital word using only a single pointer per clock cycle.

BRIEF DESCRIPTION OF THE DRAWINGS

A more complete appreciation of the described embodiments is better understood by reference to the following Detailed Description considered in connection with the accompanying drawings, in which like reference numerals refer to identical or corresponding parts throughout, and in which:

FIG. 1 illustrates the error distribution and DAC output word sequence for a conventional DAC;

FIG. 2 illustrates the error distribution and DAC output word sequence for a DAC using a random averaging technique;

FIG. 3 illustrates the error distribution and DAC output word sequence for a DAC using a high pass averaging technique;

FIG. 4 illustrates the error distribution and DAC output word sequence for a DAC using a bidirectional data weighted averaging technique;

FIG. 5 illustrates the error distribution and DAC output word sequence for a DAC using a low pass averaging (LPA) technique used in an embodiment of a sigma delta modulator (SDM) shown in FIG. 6;

DETAILED DESCRIPTION

Figure 1:
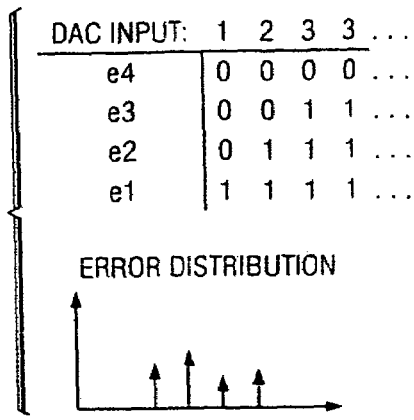
FIGS. 1–5 illustrate quantization error distributions and sequences of DAC output words (comprising elements e4, e3, e2, e1) that result if a two-bit input sequence (01, 10, 11, 11; that is, decimal equivalent 1, 2, 3, 3) is input to various DACs; specifically.

In describing embodiments illustrated in the drawings, specific terminology is employed for the sake of clarity. However, the invention is not intended to be limited to the specific terminology so selected, and it is to be understood that each specific element includes all technical equivalents that operate in a similar manner to accomplish a similar purpose. Various terms that are used in this specification are to be given their broadest reasonable interpretation when used to interpret the claims.

Moreover, features and procedures whose implementations are well known to those skilled in the art are omitted for brevity. For example, design, selection, and implementation of basic electronic and logical circuit elements such as filters, integrators, barrel shifters, quantizers, digital-to-analog converters, analog-to-digital converters, signal level shifters, buffers, logic elements, current and voltage sources, diodes, bipolar transistors, metal oxide semiconductor field effect transistors (MOSFETs), delay elements, and the like, lie within the ability of those skilled in the art, and accordingly any detailed discussion thereof may be omitted.

Figure 4:
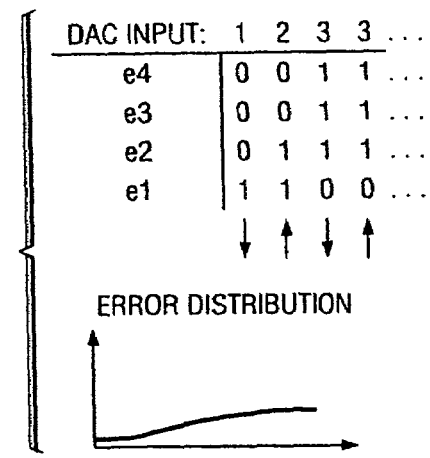
Figure 5:
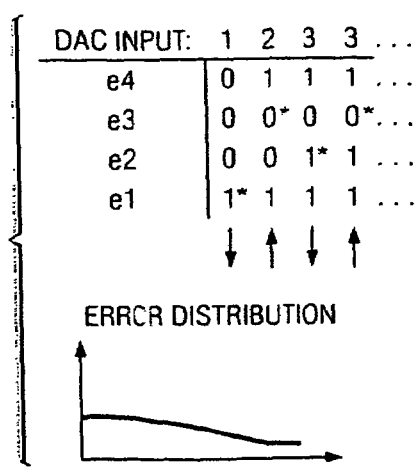
Figure 6:
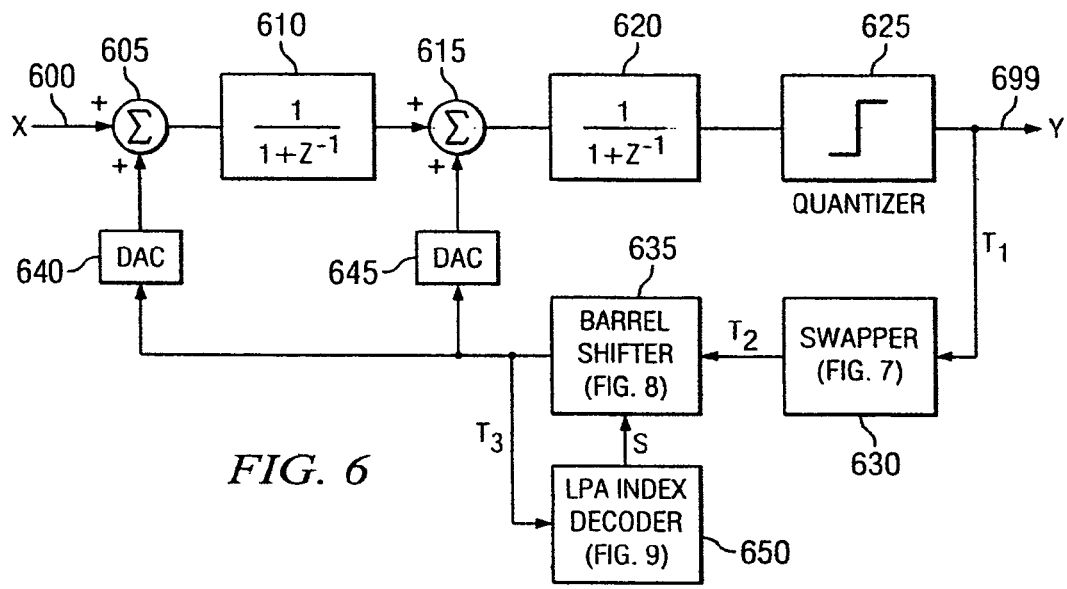
FIG. 6 is a second-order high pass sigma delta modulator (SDM) using low pass averaging (LPA) according to one embodiment.

In contrast to the approaches shown in FIGS. 1–4, the approach embodied in FIGS. 5 and 6 suppresses DAC error at high frequency, around $F_S/2$ (half the sampling frequency). Advantageously, the approach produces a low pass DAC error distribution that resembles the frequency distribution of low pass noise (see bottom half of FIG. 5). This approach is suitable for use in systems that use only the upper portion of the bandwidth, such as in high pass sigma delta modulators (SDMs).

FIG. 6 is a second-order high pass SDM. In FIG. 6, DAC error is converted into low pass noise as shown in FIG. 5.

In FIG. 5, the dots show where the next shifting will start, and arrows show the shifting direction. In the approach shown in FIGS. 5, 6, the shifting direction is reversed every clock cycle, with a single pointer rather than two pointers as in Fujimori's approach (FIG. 4). In contrast to conventional approaches, the present approach re-uses previously used elements as much as possible. In this way, DAC error is converted into low pass noise, since its high frequency components are suppressed around $F_S/2$ (half the sampling frequency).

Referring in more detail to FIG. 6, a digital input word X on line 600 is input to a first adder 605. First adder 605 provides a sum output to a first digital filter 610, which provides a first filter output to a second adder 615. Second adder 615 provides a second sum output to a second digital filter 620. Second digital filter 620 provides a second filter output to a quantizer 625 that quantizes its input to provide an SDM digital output Y on path 699. In the described embodiment, filters 610, 620 are high pass filters, so that FIG. 6 constitutes a high pass sigma delta modulator (SDM).

Figure 8:
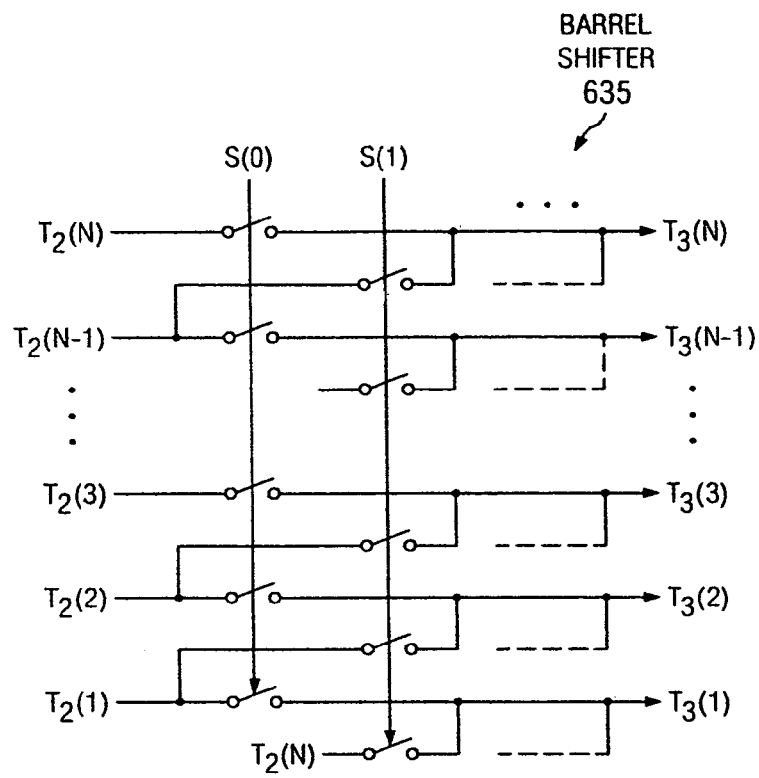
FIG. 8 illustrates one possible operation of barrel shifter 635 (FIG. 6)
Figure 9:
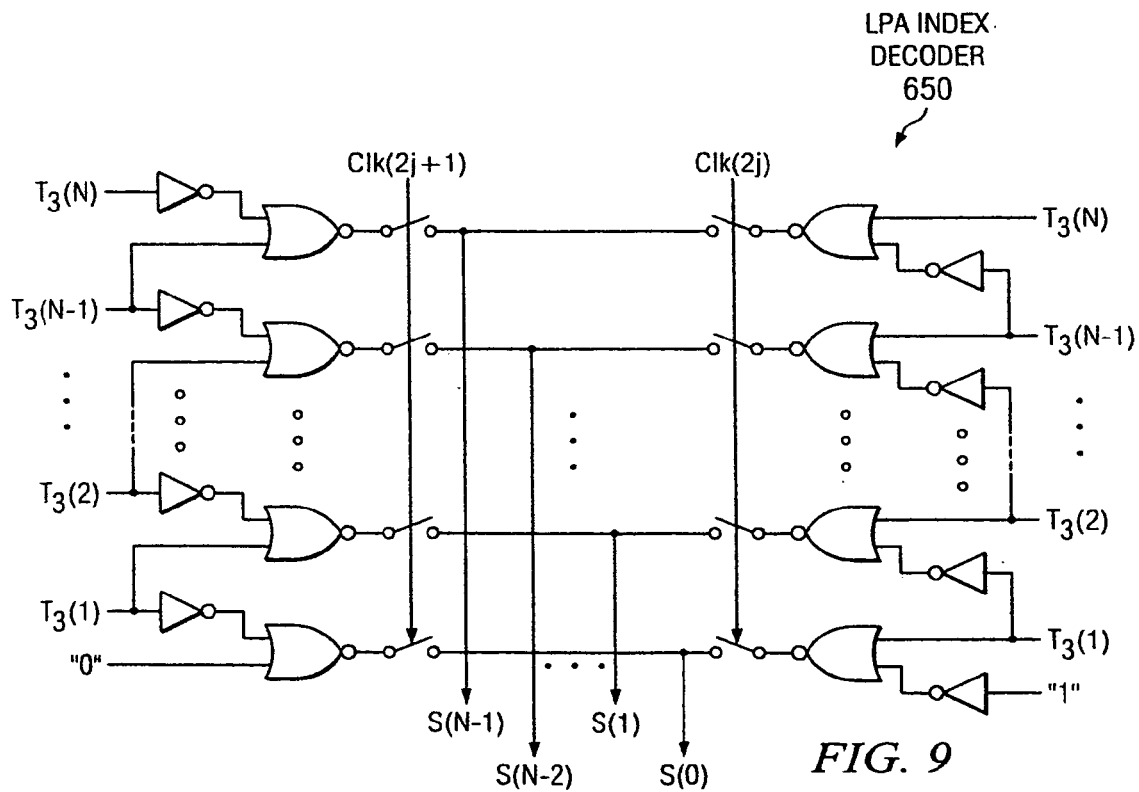
FIG. 9 illustrates one possible implementation of low pass averaging (LPA) index decoder 650 (FIG. 6).

Digital output Y, expressed in thermometer code, is fed back to a swapper 630, which provides a swapped output to a barrel shifter 635. The digital output of barrel shifter 635 is fed back to an index decoder 650, which provides a shift control word S that determines operation of barrel shifter 635 during a subsequent shifting cycle. Symbolically:

swapper 630 converts thermometer code signal Y=T1 to signal $T_2$ (see FIG. 7), barrel shifter 635 converts thermometer code signal $T_2$ to thermometer code signal $T_3$ (see FIG. 8), and LPA index decoder 650 uses signal thermometer code signal $T_3$ to calculate shift control word S that constitutes a control input to barrel shifter 635 (see FIG. 9).

Barrel shifter 635 provides a digital output to digital-to-analog converters (DACs) 640, 645 whose analog outputs are provided to respective adders 605, 615, mentioned above. It is the DAC errors caused by element mismatch within each of DACs 640, 645 that are suppressed by the described embodiment.

Figure 7:
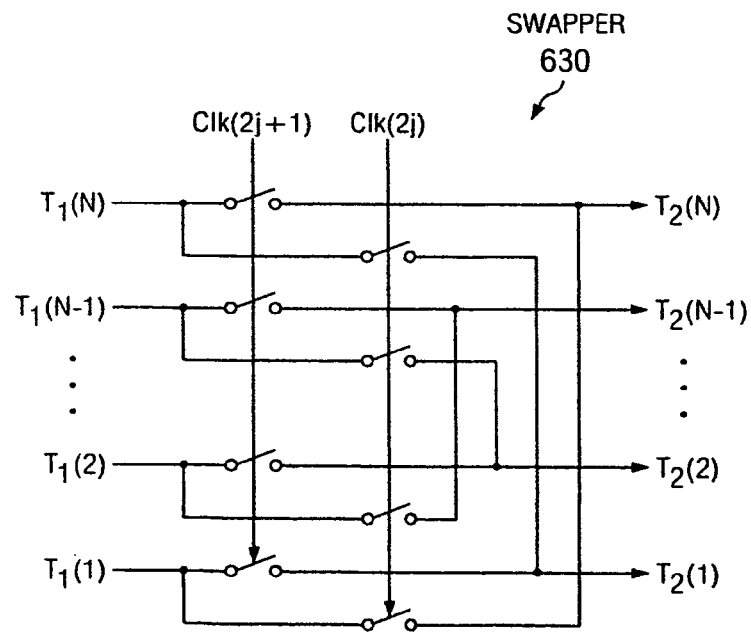
FIG. 7 illustrates one possible operation of swapper 630 (FIG. 6)

FIG. 7 illustrates one possible operation of swapper 630 (FIG. 6). A thermometer-code digital word Y (FIG. 6) is fed back to the swapper as an N-bit word. On odd-numbered clock cycles, which are signified by "Clk(2j+1)," the swapper passes the bits straight through so that output $T_2(i)=T_1(i)$. However, on even-numbered clock cycles, which are signified by "Clk(2j)," the swapper performs a swapping operation according to the formula $T_1(N-i)=T_2(i)$, essentially reversing the order of the word's bits. The swapper's output word $T_2$ is sent to barrel shifter 635.

FIG. 8 illustrates one possible operation of barrel shifter 635, which may be a conventional barrel shifter. The end-around connections are omitted for simplicity; it is understood that, for example, $T_2(N)$ connects to the lower input to $T_3(1)$. N-bit input words are shifted upward from zero through N−1 bit positions, depending on the values of an N-bit shift control word S received from LPA (low pass averaging) index decoder 650.

In the simplified illustration in FIG. 8, only two bits of the shift control word S are shown. If S(0) is active, then the bits of $T_2$ pass straight through to barrel shifter output $T_3$, reflecting a zero-bit "shift." If S(1) is active, then the bits of $T_2$ are shifted upward one bit position, with the highest-numbered bit being shifted around to the lowest output big position. More generally, if S(i) is active, then the bits of $T_2$ are shifted "i" bits to form output $T_3$, where $0 \leq i \leq N-1$. Only selected ones of N control bits is active at a time so that the input word $T_2$ is shifted a defined number of bit positions.

FIG. 9 illustrates one possible operation of LPA (low pass averaging) index decoder 650. Briefly, the index of the LPA is updated according to the expression:

$$LPA(j) = LPA(j-1) + \frac{1+(-1)^j}{2} n_Q + \frac{1-(-1)^j}{2} (2^N - n_Q) \quad \text{(Expression 1)}$$

in which:
LPA(j) denotes a current pointer value output by the LPA index decoder;
LPA(j−1) denotes a previous pointer value output by the LPA index decoder;
N is the total number of bits in the quantizer 625 (which also determines the size of words $T_1$ and $T_2$);
$n_Q$ is the number of logic "1"s in the thermometer code generated from the by the quantizer 625;
Q is a subscript denoting quantizer 625; and
j is an index indicating a sequence number of the clock.

Functions needed for implementing this expression include addition, odd sequence selection, and even sequence selection. Addition may be realized using "01" or "10" detectors implemented through logic gates. The odd and even sequence selection is achieved through alternate clock cycles denoted "Clk(2j+1)" and "Clk(2j)."

The LPA index decoder provides a single pointer, whereas Fujimori's FIG. 4 approach requires two independent pointers. Significantly, the FIG. 9 LPA decoder embodiment provides an advantage over arrangements such as FIG. 4: the DAC error distribution is a low-pass profile (FIG. 5), suppressing DAC error at higher frequencies approaching half the sampling frequency, contrasting with Fujimori's high-pass profile (FIG. 4).

Referring in more detail to FIG. 9, first and second sets of logical NOR gates provide alternate sets of N-bit shift control words S to determine operation of barrel shifter 635 (FIGS. 6, 8). Specifically:

A first set of N logical NOR gates provides the N-bit shift control word S on odd-numbered clock cycles, which are signified by "Clk(2j+1)." The i-th NOR gate, $1 \leq i \leq N$, receives an inverted $T_3(i)$ and an uninverted $T_3(i-1)$, where $T_3(0)$ is assumed to be "0".

A second set of N logical NOR gates provides the N-bit shift control word S on even-numbered clock cycles, which are signified by "Clk(2j)." The i-th NOR gate, $1 \leq i \leq N$, receives an uninverted $T_3(i)$ and an inverted $T_3(i-1)$, where $T_3(0)$ is assumed to be "1".

In the embodiment of FIGS. 6–9, the shifting direction is reversed every clock cycle, with the use of only a single pointer. An effect of this approach is to suppress high-frequency components of the DAC error distribution to give the distribution its desired low-pass characteristics (see FIG. 5). Advantageously, this embodiment attempts to re-use previously-used elements as much as possible.

A second-order high pass sigma delta modulator (SDM) with a five-bit quantizer built according to FIG. 6 was used in simulations. It is recognized that the present technique can be used in other applications as well.

In FIG. 6, X is the analog input and Y is the digital output. The five-bit quantizer was assumed to be ideal, but the DAC is assumed to contain element mismatch and thus is considered non-ideal. A thermometer code is fed into a shifting network such as barrel shifter 635, to be shifted according to a shift control word output by an index decoder such as LPA index decoder 650. Concurrently, the thermometer code updates the shift control word pointer for a subsequent shifting operation.

A variety of approaches can be implemented in the dynamic element matching (DEM) arrangement in FIG. 6. The above high pass sigma delta modulator was simulated in a system-level simulator written in C. The present approach was implemented along with others, for comparison. The five-bit DAC had 32 elements, with a mismatch of 0.1% (rms) from element to element. A total of 65,536 samples was used for FFT analysis. The modulator was tested with both one-tone and two-tone inputs. To demonstrate the effectiveness of the present approach, quantization noise from the output was reduced to a negligible level by cascading two more ideal stages to the modulator. Therefore, the modulator output included only the fundamental input and DAC errors.

With a one-tone input of −1 dB, large harmonic distortion components were generated with a conventional D/A conversion scheme (FIG. 1). With an element mismatch of 0.1%, spurious free dynamic range (SFDR) was limited to be about −80 dB and signal-to-noise+distortion ratio (SNDR) was about 71.4 dB with an oversampling ratio (OSR) of 16.

In contrast, with the low pass averaging (LPA) embodiment described herein, harmonic distortion components were removed, and the noise floor (=DAC error) was lower at high frequency range, clearly demonstrating low pass characteristics. The SFDR was larger than 120 dB, and SNDR was 99.3 dB.

Figure 2:
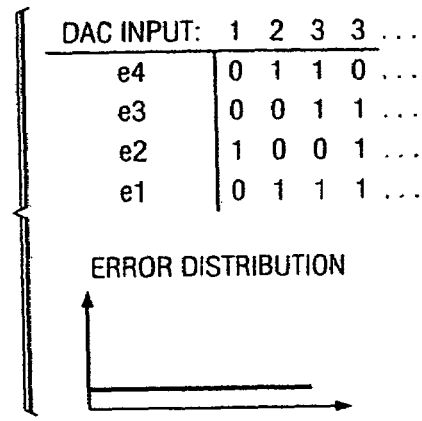
Figure 3:
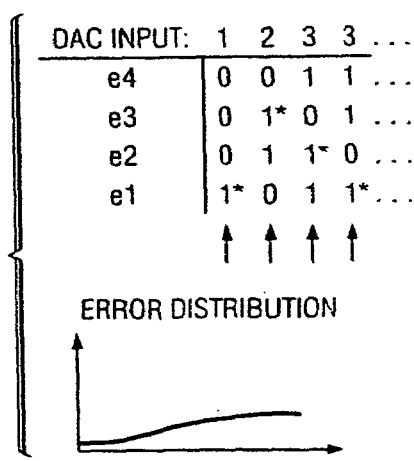

For further comparison, the modulator was also simulated with a random averaging algorithm incorporated (see FIG. 2). Using the present low pass averaging (LPA) approach (FIG. 5), the SNDR was improved significantly over both the conventional D/A scheme (FIG. 1) and random averaging algorithm (FIG. 2).

The two-tone test also showed similar suppression of DAC error. With both tones at −7 dB (to avoid overloading) and without using any averaging scheme, large harmonic distortions (HDs) as well as intermodulation distortions (IMDs) were found in the conventional arrangements. However, by applying the present LPA algorithm, all distortions (HDs and IMDs) were removed. A low pass shaped noise floor was demonstrated for two-tone test as in the one-tone test.

Thus, according to the present approach, a new dynamic element matching approach converts DAC mismatch error into low pass noise. DAC noise shaping is realized by shifting the DAC elements in a way that the previously used elements are used for successive conversions as much as possible. This approach is useful because no precision element is needed for high linearity. It is especially useful for use in systems that use only the upper portion of the Nyquist bandwidth.

The foregoing embodiments support an arrangement for suppressing digital-to-analog converter (DAC) error arising from mismatched elements contained in a DAC (640 and/or 645) that is part of a modulator (FIG. 6) that provides a digital output (Y). The arrangement includes a shifting arrangement (635) configured to controllably (650) shift a digital word (T2) derived from the digital output (Y) so as to cause a DAC error distribution (FIG. 5) to constitute a low pass profile suppressing DAC error at higher frequencies around half a sampling frequency.

The shifting arrangement may controllably shift the digital word (T2) using only a single pointer per clock cycle.

The arrangement may also include a low pass averaging (LPA) index decoder (650) that is configured to control the shifting arrangement (635) to shift the digital word (T2) in a manner that causes the DAC error distribution (FIG. 5) to constitute the low pass profile.

The LPA index decoder (650) may be configured to provide an output according to Expression 1, provided above.

The LPA index decoder (650) may include a first plurality of logic gates (left side of FIG. 9), each having a first input and a second input, and a first output that is turned on only when a logic 0 is input to the first input and a logic 1 is input to the second input, wherein the first outputs from the first plurality of logic gates collectively control the shifting arrangement (635) at odd numbered clock cycles; the LPA index decoder may further include a second plurality of logic gates (right side of FIG. 9), each having a first input and a second input, and a second output that is turned on only when a logic 1 is input to the first input and a logic 0 is input to the second input, wherein the second outputs from the second plurality of logic gates collectively control the shifting arrangement (635) at even numbered clock cycles.

The arrangement may further include a swapper (630), configured to receive the digital output (Y) and to provide to the shifting arrangement (635), on alternating clock cycles, respectively: (i) the digital output (Y); and (ii) a swapped output containing bits of the digital output (Y) in reverse order.

The digital output (Y=T1), the digital word (T2) input to the shifting arrangement (635) and an output (T3) of the shifting arrangement, may all be thermometer codes.

The foregoing embodiments also support a shifting arrangement that includes a shifter (635) configured to shift a digital input word (T2) in a first direction on even-numbered clock cycles and in a second direction opposite the first direction on odd-numbered clock cycles that alternate with the even-numbered clock cycles, and to provide a resulting shifted digital word (T3) that constitutes the digital input word (T2) shifted by a number of bit positions determined by a shift control word (S); the shifting arrangement also includes a decoder (650), configured to calculate, based at least in part on the shifted digital word (T2), the shift control word (S) that determines a number of bits by which the shifter (635) shifts the digital input word (T2) to form the resulting shifted digital word (T3).

The shifter (635) may be a barrel shifter.

The decoder (650) may provide a single pointer (S) per clock cycle to the shifter (635).

The shifter may be contained in a modulator that includes a digital-to-analog converter (DAC) having mismatched elements causing errors that are characterized by a DAC error distribution (FIG. 5). The decoder may constitutes a low pass averaging (LPA) index decoder (650) that is configured to control the shifter (635) to shift the digital word (T2) in a manner that causes the DAC error distribution (FIG. 5) to constitute a low pass profile suppressing DAC error at higher frequencies around half a sampling frequency.

The LPA index decoder (650) may be configured to provide an output according to Expression 1, provided above.

The LPA index decoder (650) may include a first plurality of logic gates (left side of FIG. 9), each having a first input and a second input, and a first output that is turned on only when a logic 0 is input to the first input and a logic 1 is input to the second input, wherein the first outputs from the first plurality of logic gates collectively control the shifter (635) at odd numbered clock cycles; and the LPA index decoder may also include a second plurality of logic gates (right side of FIG. 9), each having a first input and a second input, and a second output that is turned on only when a logic 1 is input to the first input and a logic 0 is input to the second input, wherein the second outputs from the second plurality of logic gates collectively control the shifter (635) at even numbered clock cycles.

The shifting arrangement may further include a swapper (630), configured to receive a digital output (Y) of the modulator, and to provide to the shifter (635), on alternating clock cycles, respectively, the digital output (Y) and a swapped output containing bits of the digital output (Y) in reverse order.

A digital output (Y=T1) of the modulator, the digital input word (T2) input to the shifter (635) and resulting shifted digital word output (T3) by the shifter, may all be thermometer codes.

Also provided is a method for suppressing digital-to-analog converter (DAC) error arising from mismatched elements contained in a DAC that is part of a modulator that provides a digital output. The method involves controllably shifting a digital word derived from the digital output so as to cause a DAC error distribution to constitute a low pass profile suppressing DAC error at higher frequencies around half a sampling frequency.

The shifting step may include shifting the digital word using only a single pointer per clock cycle.

The method may further involve using a low pass averaging (LPA) index decoder to cause the digital word to be shifted in a manner that causes the DAC error distribution to constitute the low pass profile.

Many alternatives, modifications, and variations will be apparent to those skilled in the art in light of the above teachings. For example, the choice of digital words of different length, and modulators of different orders, lies within the scope of the present invention. Further, the design and adjustment of a variety of swappers, barrel shifters, and index decoders lie within the contemplation of the invention. It is therefore to be understood that within the scope of the appended claims and their equivalents, the invention may be practiced otherwise than as specifically described herein.

What is claimed is:

1. A shifting arrangement, comprising:
a shifter configured to shift a digital input word in a first direction on even-numbered clock cycles and in a second direction opposite the first direction on odd-numbered clock cycles that alternate with the even-numbered clock cycles, and to provide a resulting shifted digital word that constitutes the digital input word shifted by a number of bit positions determined by a shift control word; and
a decoder, configured to calculate, based at least in part on the shifted digital word, the shift control word that determines a number of bits by which the shifter shifts the digital input word to form the resulting shifted digital word.

2. The shifting arrangement of claim 1, wherein:
the shifter is contained in a modulator that includes a digital-to-analog converter (DAC) having mismatched elements causing errors that are characterized by a DAC error distribution; and
the decoder constitutes a low pass averaging (LPA) index decoder that is configured to control the shifter to shift the digital word in a manner that causes the DAC error distribution to constitute a low pass profile suppressing DAC error at higher frequencies around half a sampling frequency.

3. The shifting arrangement of claim 2, wherein the LPA index decoder is configured to provide an output according to an expression:

$$LPA(j) = LPA(j-1) + \frac{1+(-1)^j}{2} n_Q + \frac{1-(-1)^j}{2}(2^N - n_Q)$$

wherein:
LPA(j) denotes a current pointer value output by the LPA index decoder;
LPA(j−1) denotes a previous pointer value output by the LPA index decoder;
N is a total number of bits in the digital input word;
$n_Q$ is a number of logic "1" bits in the digital input word; and
j is a clock signal index number.

4. The shifting arrangement of claim 2, wherein the LPA index decoder includes:
a first plurality of logic gates, each having a first input and a second input, and a first output that is turned on only when a logic 0 is input to the first input and a logic 1 is input to the second input, wherein the first outputs from the first plurality of logic gates collectively control the shifter at odd numbered clock cycles; and
a second plurality of logic gates, each having a first input and a second input, and a second output that is turned on only when a logic 1 is input to the first input and a logic 0 is input to the second input, wherein the second outputs from the second plurality of logic gates collectively control the shifter at even numbered clock cycles.

5. The shifting arrangement of claim 2, further comprising a swapper, configured to receive a digital output of the modulator, and to provide to the shifter, on alternating clock cycles, respectively:
the digital output; and
a swapped output containing bits of the digital output in reverse order.

6. The shifting arrangement of claim 2, wherein:
a digital output of the modulator, the digital input word input to the shifter and resulting shifted digital word output by the shifter, are all thermometer codes.

7. The shifting arrangement of claim 1, wherein:
the shifter is a barrel shifter.

8. The shifting arrangement of claim 1, wherein:
the decoder provides a single pointer per clock cycle to the shifter.

* * * * *